United States Patent [19]

Bluzer

[11] Patent Number: 4,636,980
[45] Date of Patent: Jan. 13, 1987

[54] THREE DIMENSIONAL OPTICAL RECEIVER HAVING PROGRAMMABLE GAIN CONTROL

[75] Inventor: Nathan Bluzer, Silver Spring, Md.

[73] Assignee: Westinghouse Electric Corp., Pittsburgh, Pa.

[21] Appl. No.: 634,339

[22] Filed: Jul. 25, 1984

[51] Int. Cl.$^4$ ............................................. G11C 11/42
[52] U.S. Cl. ..................................... 365/106; 365/118; 358/213; 357/30
[58] Field of Search ............... 365/106, 112, 114, 118; 358/213; 357/30, 31, 32

[56] References Cited

U.S. PATENT DOCUMENTS

| | | | |
|---|---|---|---|
| 4,216,503 | 8/1980 | Wiggins | 358/280 |
| 4,314,743 | 2/1982 | Rast | 350/354 |
| 4,321,614 | 2/1982 | Bluzer et al. | 357/30 |
| 4,323,925 | 4/1982 | Abell et al. | 358/213 |
| 4,359,651 | 11/1982 | Bluzer | 307/311 |

Primary Examiner—Terrell W. Fears
Attorney, Agent, or Firm—W. G. Sutcliff

[57] ABSTRACT

There has been provided a monolithic three dimensional image optical receiver having contiguous detectors formed into a solid state lens for producing photogenerated electrons. A plurality of collectors, one each located in communication with the detectors, are disposed on a substrate and having spaced or interstices therebetween. An exponentially variable programmable gain control is located on the image or radiation receiving side of the detector.

11 Claims, 6 Drawing Figures

THREE DIMENSIONAL OPTICAL RECEIVER HAVING PROGRAMMABLE GAIN CONTROL

STATEMENT OF GOVERNMENT INTEREST

The invention described herein may be manufactured in and used by or for the Government for governmental purposes without payment of a royalty thereon.

BACKGROUND OF THE INVENTION

The present invention relates to an optical signal detection and processing apparatus. More particularly, a three dimensional image receiver having contiguous detectors coupled to a peristaltic charge coupled device (PCCD) memory is disclosed.

Three dimensional imagers may be used in many applications, including threat warning receivers, and optical ranging and terrain mapping systems. Generally, three dimensional imaging is accomplished by taking successive samples of an object or target with an XY array. Successive samples taken rapidly, in the order of several nanoseconds apart, provide range resolution. For example, an object illuminated by a laser pulse reflects a spacial image to a three dimensional receiver. The reflections will be spread in time depending upon the depth dimension of the object. Thus, the spacial distribution of the XY images, taken rapidly as aforesaid, provide data for forming the three dimensional image.

The architecture of the detector of the present invention is primarily dictated by the requirement to compress the bandwidth of the device for improved performance. The operating frequency of the sensor of the present invention is about 50 MHz. Because the signals are extremely small, special receivers are required. Such receivers employ bandwidth compression to improve range performance. For example, a 3-D image may be taken every 30 mSec. For the range over which the receiver is operated, all of the 3-D image information arrives in less than 100 mSec. Thus, only a small part of the time between the transmit and receive pulse is used. The low operating duty cycle of the detector can be used to reduce the output bandwidth if the bandwidth compression is employed. If the system operates entirely in the charge domain, the full advantages of bandwidth compression will be realized. Because there is no interim signal amplification before read-out, wherein noise from the interim amplifies would be added, the noise bandwidth is determined by the read out rate. Operating in the charge domain thus reduces noise through reduction of the noise bandwidth and eases the speed requirement on any postprocessing.

In the United States Patent application entitled THREE DIMENSIONAL OPTICAL RECEIVER HAVING PROGRAMMABLE GAIN SENSOR STAGES executed Dec. 20, 1983, and assigned to the assignee herein, a hybrid or two tier, multilevel, staircase structure having programmable gain control and a charge coupled memory device is disclosed. The two tier structure provides the needed access between the charged coupled device memory (CCD) and a plurality of contiguous detectors. The contiguous arrangement enhances detection through the elimination of dead areas in the sensor.

In the above identified application, each detector is coupled to a programmable gain control element, which adjusts the sensitivity of the detector as a function of the anticipated light energy to be received. For example, for near distances, the signal received by the detector may be as high as $10^9$ photons, a level well beyond the holding capacity of a CCD. At far ranges, the detector may receive less than $10^3$ photons. Thus, the programmable element adjusts the gain or injection efficiency between the detector and the CCD so that the input signal to the CCD is within the charge capacity of the CCD.

The CCD is used as an analog buffer memory for fast transient recording of the signals from the detectors. A multiplexer is used to slowly read out the contents of the CCD buffer memory line by line through a read out device.

In the aforementioned patent application, the optical receiver is a hybrid or constructed in a two tiers which satisfies the requirement for continguous detectors while concurrently providing physical access to the memory. In the present invention, the detectors are made contiguous by other means. The entire optical receiver may thus be built from a single monolithic integrated circuit. The device is thereby simplified and fabrication and operation is rendered more efficient.

In the present invention, the detector is made contiguous on one side and effectively non-contiguous on an opposite side. The structure thereby provides sufficient room between the detectors on the non-contiguous side for access to the memory without the necessity of a hybrid structure.

Another aspect of the hybrid structure is that the programmable gain control element is located at the output side of the detector and is geometrically limited because gain is controlled by a programmable area division. That is, the gain is adjusted as a fraction of the physical area available for the charge entering the memory relative the total area available for the charge exiting from the detector. In the present invention, the gain control element is located at the radiation receiving side of the detector, and the gain is varied exponentially by controlling the bias over time. Thus, the gain control provided has a much greater dynamic range.

The present invention thus addresses two major problems associated with known image detectors. First, the invention provides for a monolithic contiguous image detecting structure, thereby eliminating the more complex hybrid structures. Second, programmable gain control is provided which is geometrically independent and exponentially variable over the dynamic range of the incoming radiation, thereby providing finer sensitivity, resolution and greater dynamic range.

SUMMARY OF THE INVENTION

There has been provided a monolithic optical receiver for reconstructing three dimensional images having continguous detectors formed into a solid state device with electrostatic lenses for producing photogenerated electrons and channeling said electrons to collectors.

A plurality of collectors, one for each detector, are located on the opposite side of a semiconductor solid and in communication with the detectors. The collectors have spaces or interstices therebetween. An exponentially variable programmable gain control is located on the image or radiation receiving side where the detector is also located.

The invention shall be described with respect to a particular embodiment. However, it should be understood to those skilled in the art, that the invention is capable of a variety of alternative embodiments. In the particular embodiment, hereinafter disclosed, the particular function of each of the various P and N type doped materials is generally known in the art. It is also known that complimentary materials of opposite type may be substituted for corresponding materials and biasing potentials may be inverted as well. Thus, in the description, hereinafter set forth, P and N type materials may be exchanged, N-epitaxial materials may be replaced by P-epitaxial materials and P+ materials may be replaced by N+ materials.

DESCRIPTION OF THE PREFERRED EMBODIMENT

Figure 1:
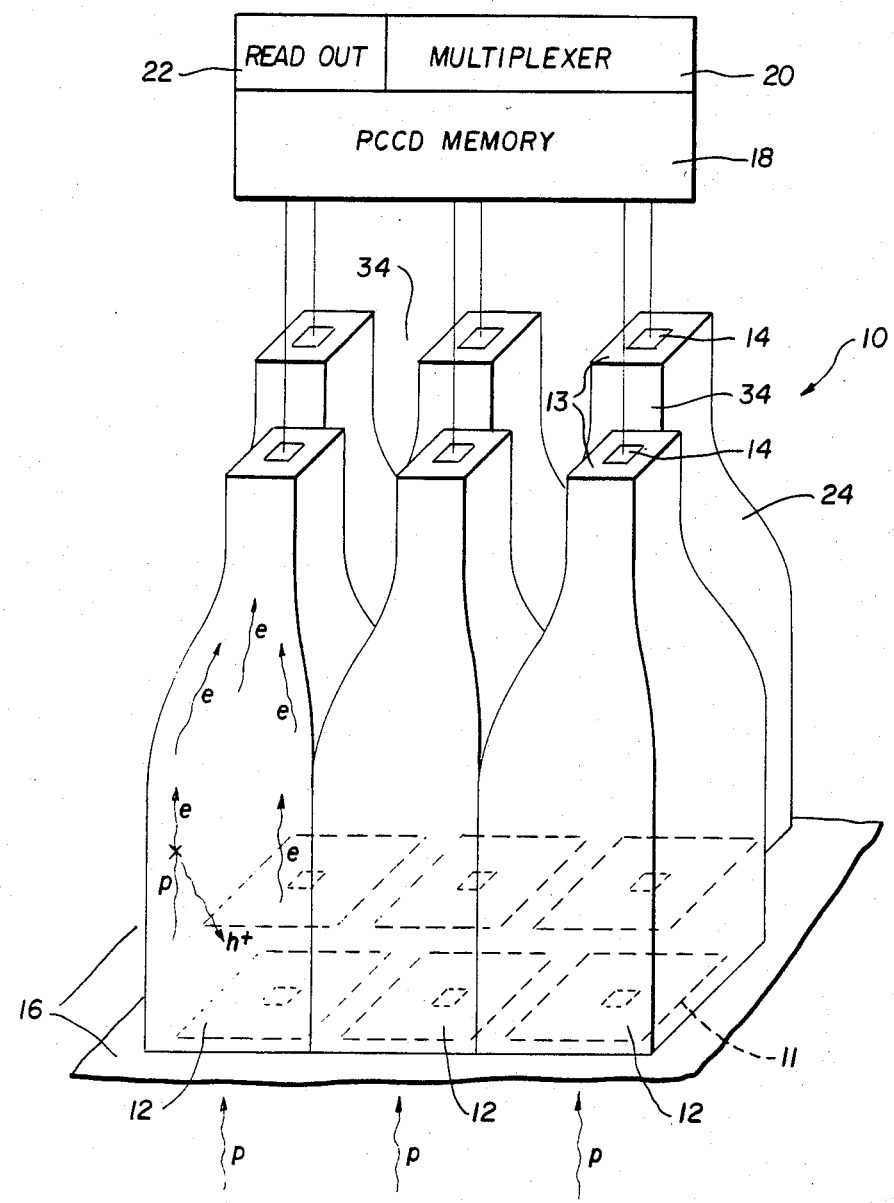
FIG. 1 is a schematic representation of a partial view, in perspective, of a three dimensional optical receiver having a contiguous detector array on an image receiving side and a non-contiguous charge collection array on an opposite side thereof.

FIG. 1 shows a schematic representation of a monolithic semi-conductor structure forming the optical receiver 10 of the present invention. The receiver 10 is formed of an array of contiguous detectors 12 having a radiation receiving surface 11 and a charge collecting or receiving surface 13. A plurality of collectors 14, located at the charge receiving surface 13, one for each corresponding detector 12, receives charge therefrom. A peristaltic charged coupled device (PCCD) memory 18 is coupled to each collector 14. A multiplexer 10 and read out 22 for the memory 18 is provided. A programmable gain control 16 is located near the radiation receiving surface 11 of the detector 12 for exponentially varying downwardly the gain or fraction from a maximumm of one of the photogenerated carriers in the detector reaching the collector 14.

It is well known that a sufficiently energetic photon p, when absorbed by a semi-conductor, such as detector 12, forms an electron e and a hole h pair. The electrons e may be collected, counted or measured for various known techniques.

In the present invention, the electrons, or charges e, photogenerated within the detector are collected, periodically sampled and stored in analog memory bins (or potential wells) which make up the PCCD memory. Because the PCCD memory is serially loaded, the spacial location of any collected analog charge packet represents the time during which such charges are received. The stored charge packets containing electrons are periodically read-out. Read-out starts after the entire PCCD buffer memory has been loaded with photogenerated signal charges. Means is provided for varying the amount of charge collected from a detector to compensate for large dynamic range of the intensity of the incoming radiation.

In the present invention the gain of the device is varied exponentially in real time in accordance with the anticipated intensity of the incoming radiation. For example, laser light transmitted at a distant object is reflected therefrom onto the receiver 10. The intensity of the reflected light varies as the inverse square of the distance separating the object and the receiver. In terms of a charge coupled device, the number of photons reflected onto the receiver 10 varies over a wide range.

At close range, the intensity of reflected radiation, or the number of photons, producing photogenerated electrons far exceed the charge storage capacity of the device. Thus, the sensitivity of the device must be reduced in order to prevent saturation. When the object is distant from the receiver 10, any and all of the charge produced as a result of the absorption of reflected light must be collected and utilized to form an image. Means are provided at the detector input for exponentially varying the amount of photogenerated electrons reaching the collectors and subsequently injected into the PCCD memory.

It should be understood that a receiver having a contiguous image receiving surface is preferred. In FIG. 1, the receiver 10 is a monolith formed by various known solid-state processing techniques. The individual detectors 12 are contiguous on the radiation receiving side 11 and effectively non-contiguous along the charge delivery or collecting side 13. That is to say, each detector 12 is arranged and configured within the semiconductor materials and biased, such that, photogenerated electrons are funneled by preconfigurated electric fields towards the corresponding collector through a (solid state lens) electrostatic lens. Interstices 34 are provided on the charge collector or delivery side 13 of the three dimensional receiver between the collectors 14 to provide room for directing coupling the collectors 14 to the PCCD analog memory buffer.

The apparatus thus acts like a three dimensional, solid state lens for electrons providing a contiguous detector surface on the image receiving side 11, with the advantages attendant thereto, along with non-contiguous collectors of photogenerated electrons on the electron delivery side 13, which provide intersital space necessary for communication with the memory.

Figure 2:
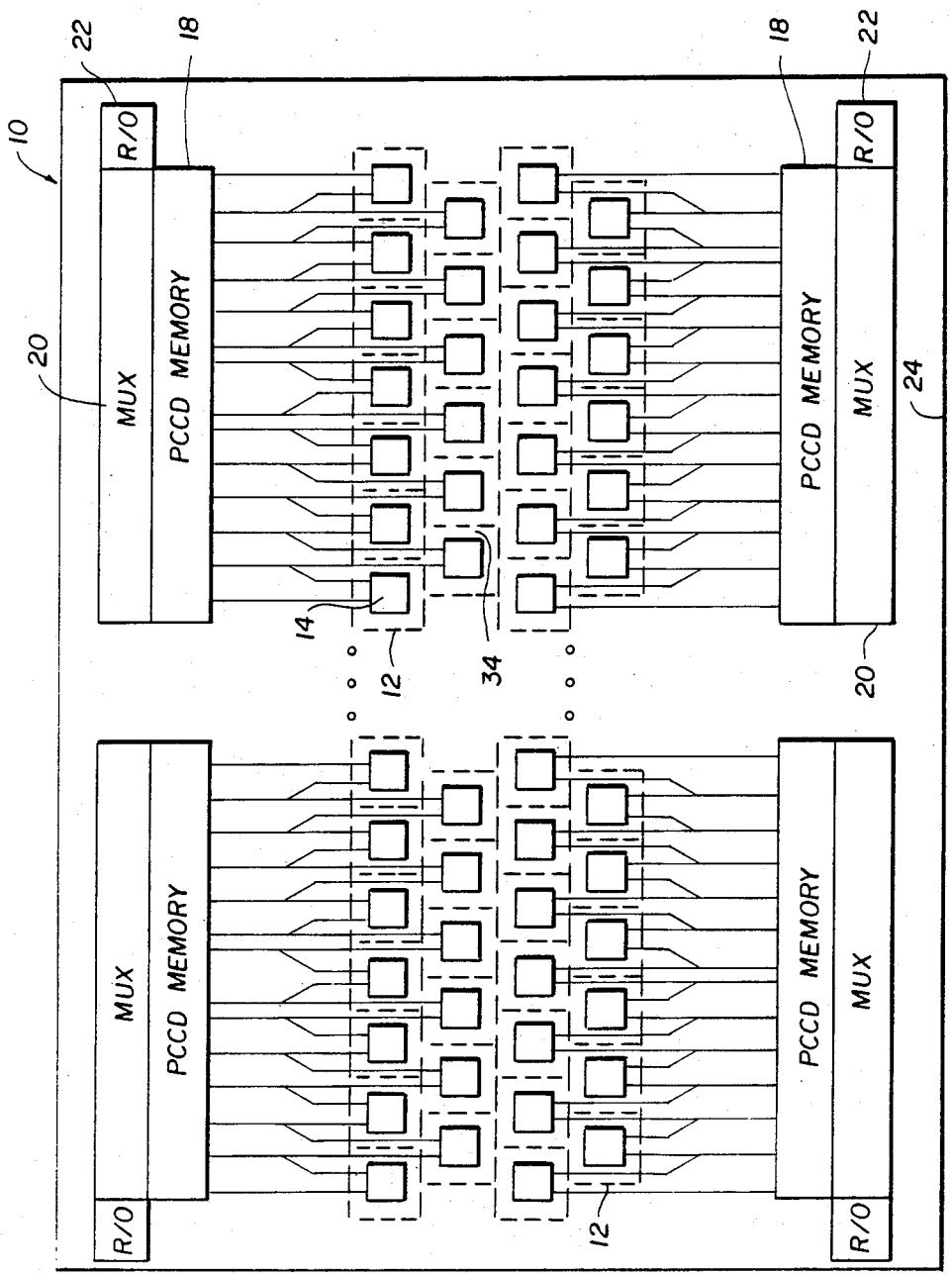
FIG. 2 is a planar schematic representation of the architecture of the system shown in FIG. 1 from the side of the collector surface.

In FIG. 2 similar elements are labeled with the same reference numbers. The view is from the charge delivery side 13 of the receiver 10. Contiguous portions of the detector 12 are shown in dotted line facing away from the viewer. The interstices 34 between the collector 14 provide sufficient area or space on the substrate 24 to allow charge coupling directly between the PCCD memory 18 and the collectors 14.

Figure 3:
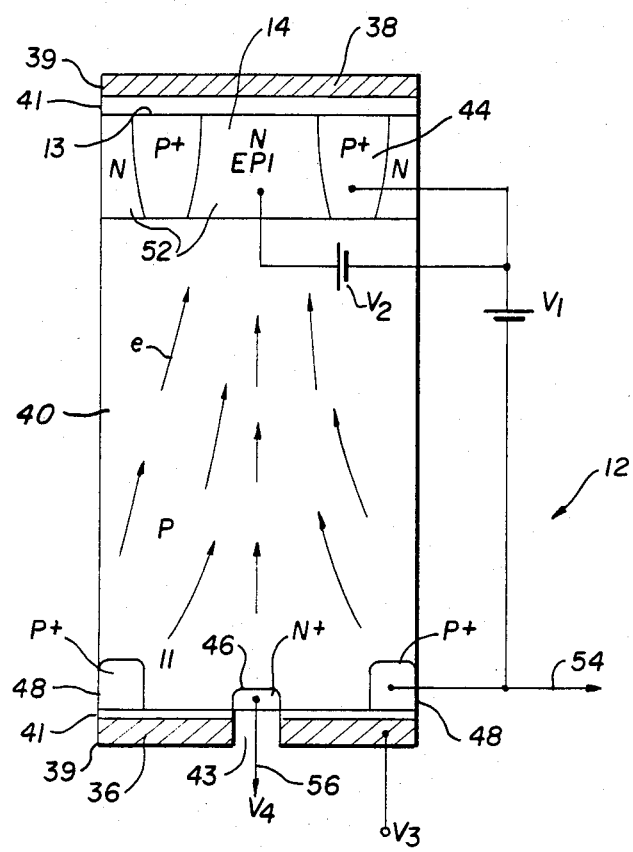
FIG. 3 is a schematic cross section representing one cell of thre three dimensional optical receiver illustrated in FIGS. 1 and 2.
Figure 4:
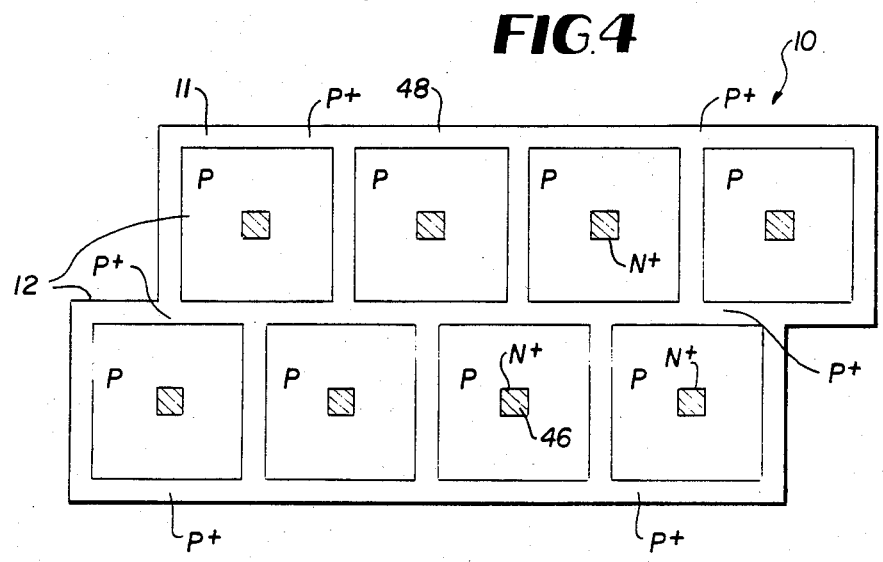
FIG. 4 is a schematic representation of a part of the radiation receiving side of the three dimensional optical receiver shown in FIG. 1.

As shown in FIGS. 1 2, and 3, the receiver 10 is a monolithic substrate 24 having diffusion zones of different N and P type semi-conductor materials. For example, the preferred embodiment cross section is shown in FIG. 3. The detector 12 sometimes hereinafter referred to as cell 12, is an integral part of the substrate 24. A major part of the substrate 24 is an absorber zone 40 depleted of free charge carriers and formed of P type semi-conductor material. The radiation receiving side 11 of the detector 12 has a peripheral P+ doped diffusion zone or P+ channel stop 48. The P+ channel stop 48 is attractive to photogenerated holes and is located close to the site where holes are formed in order to reduce the capture time of the holes and thereby increase the sensitivity of the detector 12. A hole drain 54 is coupled to the P+ channel stop 48 to bleed the collected holes from the device.

An N+ difusion zone or region 46 is located in the center of the radiation receiving side 11 as shown. The N+ region 46 captures electrons. An electron drain 56, coupled to the N+ diffusion zone 46, bleeds collected electrons from the system as part of the programmable gain control, hereinafter described.

The collector 14 is opposite the radiation receiving side 11 of the detector 12. The collector 14 is bounded by the P+ region of a doped semi-conductor material 44 located peripherally of the electron delivery side 13 of the detector 12. N-epitaxial material 52 (hereinafter referred to as N-EPI) is located centrally of the P+ material 44 and is attractive to electrons.

The detector 12 is biased as shown by the voltages V1, V2, V3 and V4 so that the charges e produced within the region 40 may be transported or channeled properly in the cell 12 to the N EPI region 52. The voltage V1 is applied between the P+ region 44 and the P+ region 48 such that the latter is more positive with respect to the former. Similarly, the voltage V2 is applied between the P+ region 44 and the N EPI region 52. Thus, the N EPI region 52 is more positive biased than either of the P+ regions 44 and 48. Consequently, electrons e are preferentially attracted to the N EPI region 52. The P+ region 44 surrounding the N EPI region 52 tends to repel the electrons and thus create a channeling or lens effect for the electrons e into the N EPI region 52 of the collector 14. The channeling is represented by the dotted arrows shown in FIG. 3. This effect also permits creation of region 34, the interstical groups.

The collector 14 is coupled to the PCCD memory 18 directly to permit charge injection from the collector into the PCCD. Charges e collected in the N EPI region 52 are periodically gated to the memory 18 by pulsing the PCCD's gate 38 attractive and repulsive (see FIG. 3).

The radiation receiving side 11 of the detector 12 has a gain control gate 36 deposited thereon. The gate 36 is a transparent electrode. An insulating layer 41 separates the respective electrodes 36 and 38 made from semiconductive material, from the body of the detector 12. A central opening 43 in gate 36 provides access for the V4 biased electron drain 56 to the N+ diffusion zone 46.

It should be understood that the P+ channel stop 48 and the N+ diffusion zones 46 are virtually transparent to incoming radiation. The gain control gate 36 in conjunction with the N+ diffusion zone 46 and the P+ channel stop regions 48 provide means for implementing programmable gain control for the detector 12 by adjusting the potentials V4 and V3.

Figure 5A:
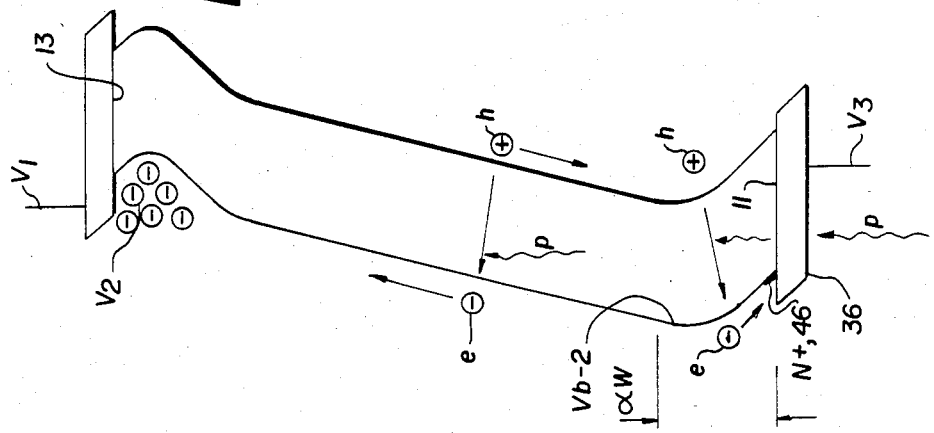
FIG. 5 is a potential diagram showing the operation of the programmable gain control feature in the 3-D receiver.
Figure 5B:
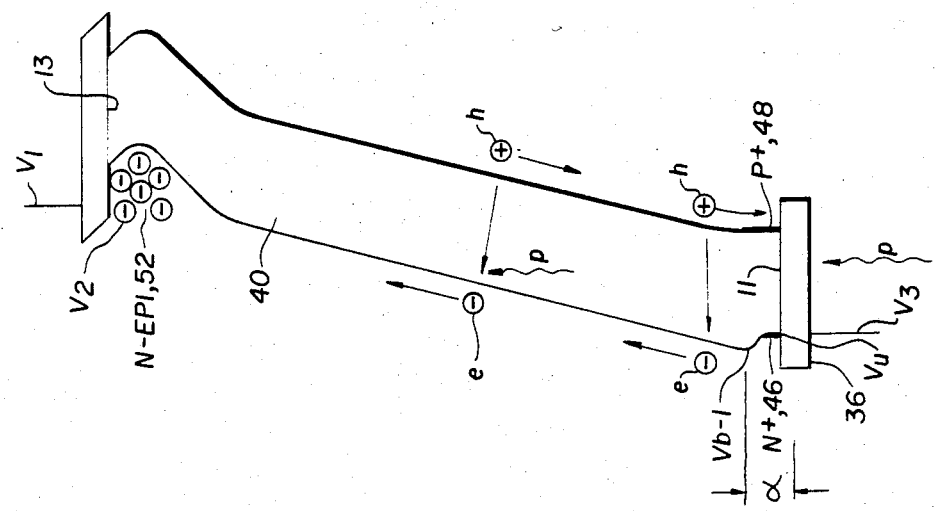

FIGS. 5A and 5B illustrate potential diagrams for two operative conditions of the detector. In FIG. 5A, the voltages V1 and V2 establish a potential configuration wherein the region 40 is depleted of free charges and signal charges are produced as a result of absorbed radiation producing photogenerated electrons e and holes h. Most of such electrons e flow towards the N EPI region 52. The reason for this is as shown in the potential diagram of FIG. 5A. The electrons are produced predominately in the material 40 above potential barrier Vb-1. Bias voltage V3 on gate 36 establishes an initial potential barrier Vb-1 and hence a gain of nearly unity.

The initial potential barrier Vb-1 may be modified by changing the bias on gate 36. This is accomplished by applying voltage V3 to the radiation receiving gate 36 as shown to thereby move the location of the potential barrier Vb-2.

In FIG. 5B, the voltage V3 is increased. Hence, the initial potential barrier Vb-1 is shifted to potential barrier Vb-2. Thus, some of electrons e produced in the absorber material 40 transport toward the N-EPI region 14, and a significant number of other electrons transport towards the N+ region 46. This occurs because some of the electrons e formed in a portion of the absorber material 40 below potential barrier Vb-2 are collected by N+ region 46, and the balance are collected by region 14 within the N-EPI 52.

In a semi-conductor material, photogenerated electrons are produced in a spacial distribution uniquely determined by the absorption length of the semi-conductor material. The absorption length, referred to by the symbol $\alpha$ is referred to as the absorption coefficient. For example, at 0.85 $\mu$M, the absorption length ($1/\alpha$) in silicon is 16 $\mu$M. Thus, a 32 $\mu$M thick layer is needed to absorb about 85% of the incident photon flux. The remainder of the photons are absorbed within the silicon in a region which is more than 32 $\mu$M from the radiation receiving side 11 of the detector. See FIG. 5A. The fraction of photons absorbed at some arbitrary distance W from the radiation gate 36 is $(1-\exp(-\alpha W))$. If the radiation gate 36 is biased, more positively, so that the original potential diagram of FIG. 5A is modified to the configuration of FIG. 5B, then the photogenerated electrons will be attracted to the radiation receiving side 11 by 36 and collected by the N+ diffusion zone 46 and drained from the system by the electron drain 56. Similarly, the photogenerated electrons generated above the potential barrier Vb-2 will be attracted to the N EPI region 14. If a bias voltage V3 is applied to the gain control gate 36, the barrier voltage Vb-2 will change accordingly and so shall the fraction of carriers reaching region 14. Because the absorption length is an exponential function, a small change in the bias on the gain control gate 36 will cause a large change in the amount of photogenerated electrons collected by the N EPI region 14. Thus, the programmable gain control is more sensitive with greater dynamic range and more selective than a system defining gain by area geometries.

Because the programmable gain control, as described herein, is at the input side of the detector 12, saturation of the collectors 14 may be effectively prevented by merely changing the bias voltage V3 on the gain control gate 36. In a geometric limited system, saturation is possible because there is less dynamic range.

The present invention thus acts like a solid-state electrostatic lens having a variable input gain at the input side. The sensitivity of the device is improved because it operates over a wide dynamic range of input radiation. The device may also be manufactured as a monolith because adequate physical space is provided betwen the collectors for coupling the charge produced in the detectors to the memory.

What is claimed is:

1. A monolithic three dimensional imaging receiver having a plurality of contiguous sensor cells whereby image detecton positions of adjacent ones of the sensor units are exposed to incident radiation and produce photogenerated electrons to form a composite image detection area for said receiver, each of said sensor cells comprising:

- a plurality of radiation detectors having a radiation receiving face and an electron delivery face;
- a plurality of programmable gain stages, each coupled to one of the plurality of detectors at the radiation receiving face;
- a plurality of charge collectors, each coupled to the electron delivery face of one of said plurality of detectors and being a smaller relative size than the detectors whereby interstices are formed therebetween;
- a buffer memory coupled to each of said collectors via said interstices;
- and biasing means for channeling the photogenerated electrons in the detector toward said relatively smaller collectors.

2. The apparatus of claim 1 wherein said plurality of charge collectors each comprise an N-epitaxial region and a boundary region of P-type semiconductor material surrounding said N-epitaxial material, being biased for preferentially drawing electrons toward the N-epitaxial region.

3. The apparatus of claim 1 wherein each of said plurality of progranmable gain stages comprises N+ type semi-conductor material diffused into a central region of the radiation receiving surface of each detector, and a bleeder lead coupled thereto; and

- a gate over said radiation receiving surface for drawing charge formed in a selected region of said detector toward said N+ region for discharging the same through said bleeder lead.

4. The apparatus of claim 1 wherein the buffer memory comprises a peristaltic charge coupled device.

5. The apparatus of claim 1 wherein multiplexing and readout means comprising a charge coupled device are coupled to said buffer memory for deriving image data for the receiver.

6. A receiver for optical radiation comprising:

- a plurality of radiation detectors for producing photogenerated electrons in response to incident radiation;
- a plurality of programmable gain stages coupled, one each, to an input of said plurality of detectors for selectively drawing photogenerated electrons formed adjacent the input thereto;
- a charge collector for each detector for collecting remaining photogenerated electrons said charge collectors being a smaller relative size than the detector;
- a buffer memory coupled to each of said collectors;
- biasing means for channeling the photogenerated electrons in the detector toward said relatively smaller collector, and;
- multiplexing and readout means coupled to said buffer memory for deriving image data from said receiver.

7. The apparatus of claim 6 wherein each of said radiation detectors comprises:

a substantially rectangular solid segment of P-type semi-conductor material having a first surface adjacent one of said plurality of programmable gain stages, said P-type material producing the photogenerated electrons which are exponentially distributed from the radiation receiving surface towards said charge delivery surface.

8. The apparatus of claim 7 wherein said collector comprises:

an N-epitaxial layer formed adjacent a surface of said rectangular segment opposite the programmable gain stages being biased for channeling the electrons established within the P-type material towards said N-epitaxial material.

9. The apparatus of claim 6 wherein said programmable gain stages comprises:

means adjacent to the radiation receiving surface for drawing charge formed in said P-type material.

10. The apparatus of claim 6 wherein the radiation detector comprises:

a substantially solid segment of N-type semiconductor material for producing photogenerated holes and having a first surface adjacent one of said plurality of programmable gain stages.

11. The apparatus of claim 10 wherein the collector comprises:

a P-epitaxial layer formed in a surface opposite the programmable gain stage.

* * * * *